(12) United States Patent
Lee

(10) Patent No.: US 7,688,148 B2
(45) Date of Patent: Mar. 30, 2010

(54) IMPLEMENTING LAYOUT OF INTEGRATED CIRCUIT CONTAINING OPERATIONAL AMPLIFIER

(75) Inventor: Chuan-Che Lee, Tainan (TW)

(73) Assignee: Himax Technologies Limited, Tainan County (TW)

( * ) Notice: Subject to any disclaimer, the term of this patent is extended or adjusted under 35 U.S.C. 154(b) by 153 days.

(21) Appl. No.: 12/024,928

(22) Filed: Feb. 1, 2008

(65) Prior Publication Data

US 2009/0195320 A1    Aug. 6, 2009

(51) Int. Cl.
*H03F 3/14* (2006.01)
(52) U.S. Cl. .......................... 330/307; 330/66
(58) Field of Classification Search ............... 330/66, 330/307; 345/204
See application file for complete search history.

(56) References Cited

U.S. PATENT DOCUMENTS 6,946,905 B2 *  9/2005  Kokubun et al. ............ 330/253
7,081,792 B2 *  7/2006  Kasai et al. ..................... 330/9

\* cited by examiner

*Primary Examiner*—Khanh V Nguyen
(74) *Attorney, Agent, or Firm*—Stout, Uxa, Buyan & Millins, LLP

(57) ABSTRACT

A method for implementing a layout of an integrated circuit containing an OP (operational amplifier) is disclosed. The method includes constructing an output path connecting an output terminal of the OP to an output pad of the OP; and constructing a feedback path connecting an input terminal of the OP to an element of the OP, the element lying in an area covering the output pad, in which a minimum distance between the element and the output pad is less than a tenth of length of the feedback path. The present invention also provides an integrated circuit device produced through the method.

11 Claims, 4 Drawing Sheets

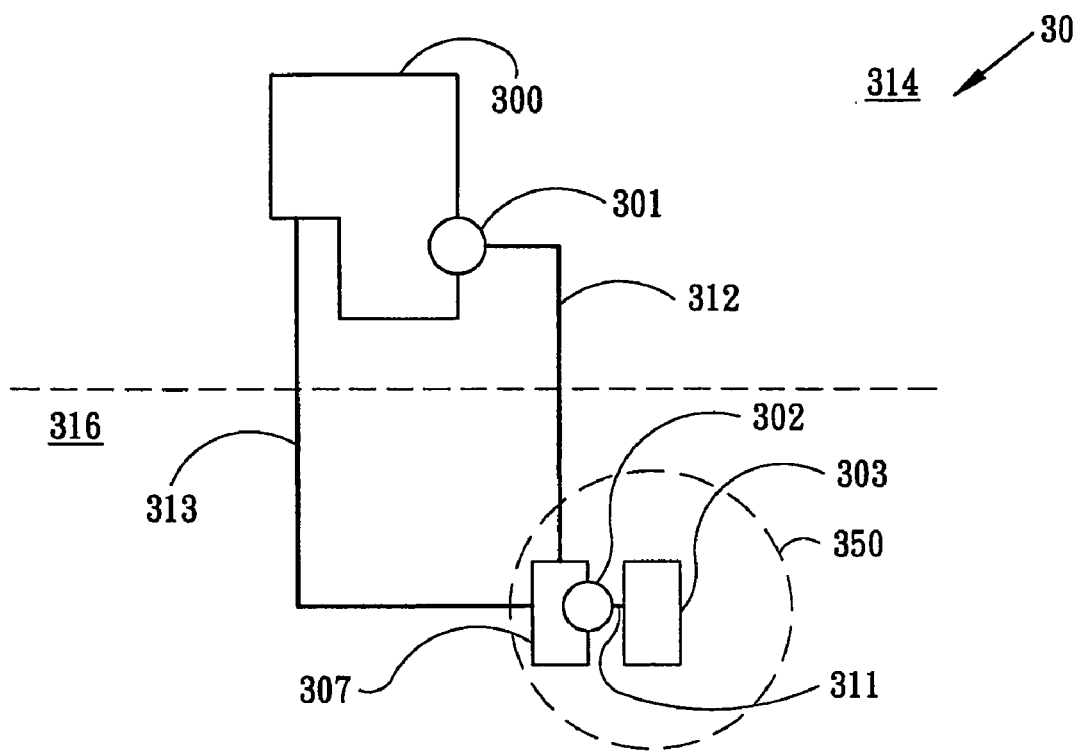

Constructing a first routing path connecting an output terminal of the OP to an output pad of the OP
402

↓

Constructing a second routing path connecting an input terminal of the OP to an element of the OP, the element lying in an area covering the output pad, in which the minimum distance between the element and the output pad is less than a tenth of length of the second routing path.
403

FIG. 4

IMPLEMENTING LAYOUT OF INTEGRATED CIRCUIT CONTAINING OPERATIONAL AMPLIFIER

BACKGROUND OF THE INVENTION

1. Field of the Invention

The present invention relates to an integrated circuit layout method, and more particularly to a method for implementing the layout of an integrated circuit containing an operational amplifier.

2. Description of the Prior Art

Operational amplifiers are among the most widely used electronic devices today, being used in a vast number of consumer, industrial, and scientific devices. An operational amplifier (hereinafter OP) is a DC-coupled high-gain electronic voltage amplifier with differential input terminals and, usually, a single output terminal. In its ordinary usage as a unit-gain buffer, the output of the OP is controlled by negative feedback which, because of the amplifier's high gain, almost completely determines the output voltage for any given input.

FIG. 1A shows a plan view illustrating a source driver layout 2. As shown in FIG. 1A, the source driver 10 includes two areas: core area 12 and pad area 14. The core area 12 is the area where some digital/analog circuits located for pixel driving. There are pads 16 disposed on the pad area 14 and used to electrically connect inputs/outputs of the digital/analog circuits in the core area 12 to external circuits.

FIG. 1B shows a plan view illustrating the core area 12 of the source driver in FIG. 1A. As shown in FIG. 1B, there are plural channels 18 and output buffets disposed in the core area 12. Each output buffer is exemplified by OP 20. Each of the channels 18 is electrically connected to the non-inverting input terminal of the OP 20. The inverting input terminal of the OP 20 is connected to the output of the OP 20.

FIG. 1C shows a schematic diagram illustrating a conventional layout pattern 10 of a part of the source driver. The layout pattern 10 includes an OP main body 20, an output pad 16 and an output path 111. The OP main body 20 includes the inverting input terminal 101, the non-inverting input terminal (not shown) and an output terminal 102 connected to the output pad 16 via the output path 111. The output terminal 102 connects to the inverting input terminal 101 via the feedback path 112. Although not explicitly specified in the figure, the OP main body 20 may further contain other elements such as elements for input stage as well as elements for output stage. The OP main body 20, the inverting input terminal 101 and the output terminal 102 are disposed within the core area 12, while the output pad 16 is disposed in the pad area 14. The output path 111 is disposed in the core area 12 and the pad area 14 both, while the feedback path 112 is disposed inside the OP 20.

FIG. 1D shows the equivalent circuit 10E corresponding to the layout pattern 10 in FIG. 1C. The circuit 10E includes an OP 100E, a first resistor R111, a second resistor R112 and the output pad N103. The OP 100E, the inverting input node 101E, the output node N102, the output pad N103, the first resistor R111 and the second resistor R112 in the equivalent circuit 10E are respectively equivalent to the OP main body 20, the inverting input terminal 101, the output terminal 102, the output pad 103, the output path 111 and the feedback path 112 in the layout pattern 10. As shown in FIG. 1D, the input voltage Gin, the feedback voltage Gfd and the output voltage Gout are the voltage respectively disposed at the non-inverting input node 101P, the output node N102 and the output pad N103. Referring to both FIG. 1C and FIG. 1D, it can be noted from the equivalent circuit 10E that the feedback path 112 forms a feedback path for the OP to operate in a feedback mode. As shown in FIG. 1D, the input voltage (Gin) in OP 100E is equal to the voltage (Gfd) in the output node N102. However, the voltage (Gfd) in the output node N102 is not equal to the voltage (Gout) in the output path because of the existence of the first resistor R111. Therefore, the output voltage (Gout) of the OP 100E is not equal to the input voltage (Gin) of the OP 100E. Because the input voltage is not equal to the output voltage in OP 100E, it would affect the display result of the display panel.

An OP typically functions as a voltage follower to drive, i.e., to provide a sufficient current and a steady voltage for, the next stage circuit. Practically, however, any routing path formed in an integrated circuit layout, such as the output path 111 or the feedback path 112 shown in FIG. 1C, possesses more or less resistance. Such resistance generally renders a voltage drop across the routing path and thus results in an output voltage offset or deviation. To a certain extent, the conventional routing scheme shown in FIG. 1C suffers from such output voltage offset problem, since the output path 111 usually runs a long way between the output terminal 102 lying in the OP main body 20 and the output pad 103 such that the resistance thereof is not small enough to be neglected. If the OP 20 in FIG. 1B is designed to provide a current I for the next stage circuit, for example, then a voltage drop V=I*R will arise when the resistance of the first resistor R111 (corresponding to the output path 111) is R. Therefore, the different lengths of the plural output paths 111 of the plural OPs 20 result in different output characteristics at the output pads 16.

A way for resolving the foregoing problem is therefore desired.

SUMMARY OF THE INVENTION

The present invention provides a method for implementing a layout of an integrated circuit containing an operational amplifier (OP). The method includes the step of: constructing an output path connecting an output terminal of the OP to an output pad of the OP; and constructing a feedback path connecting an input terminal of the OP to an element of the OP, the element lying in an area covering the output pad, in which a minimum distance between the element and the output pad is less than a tenth of length of the feedback path.

The present also provides an integrated circuit device produced through above method.

BRIEF DESCRIPTION OF THE DRAWINGS

FIG. 3 shows a schematic diagram illustrating a layout pattern of an OP in an integrated circuit device in accordance with another embodiment of the present invention.

FIG. 4 summarizes the essential steps of a method for implementing the layout of an integrated circuit containing an OP in accordance with an aspect of the present invention.

DETAILED DESCRIPTION OF THE INVENTION

In the following description of the exemplary embodiments, reference is made to the accompanying drawings which form a part hereof, and in which is shown by way of illustration various manners in which the present invention may be practiced. It is to be understood that other embodiments may be utilized, as structural and operational changes may be made without departing from the scope of the present invention.

Figure 1A:
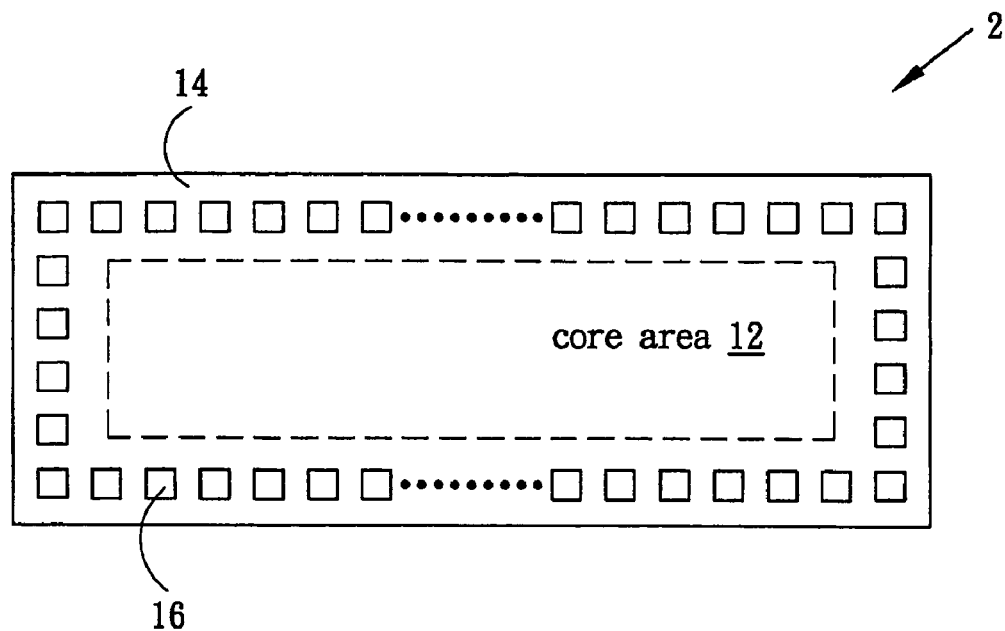
FIG. 1A shows a plan view illustrating a conventional source driver layout.
Figure 1B:
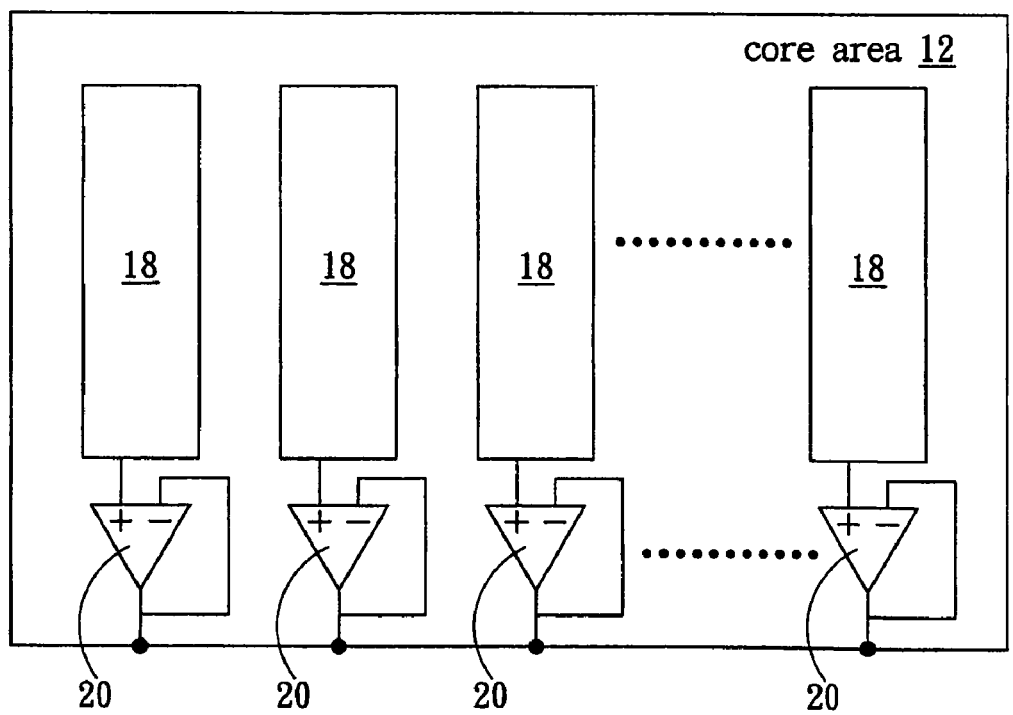
FIG. 1B shows a plan view illustrating the core area of the conventional source driver in FIG. 1A.
Figure 1C:
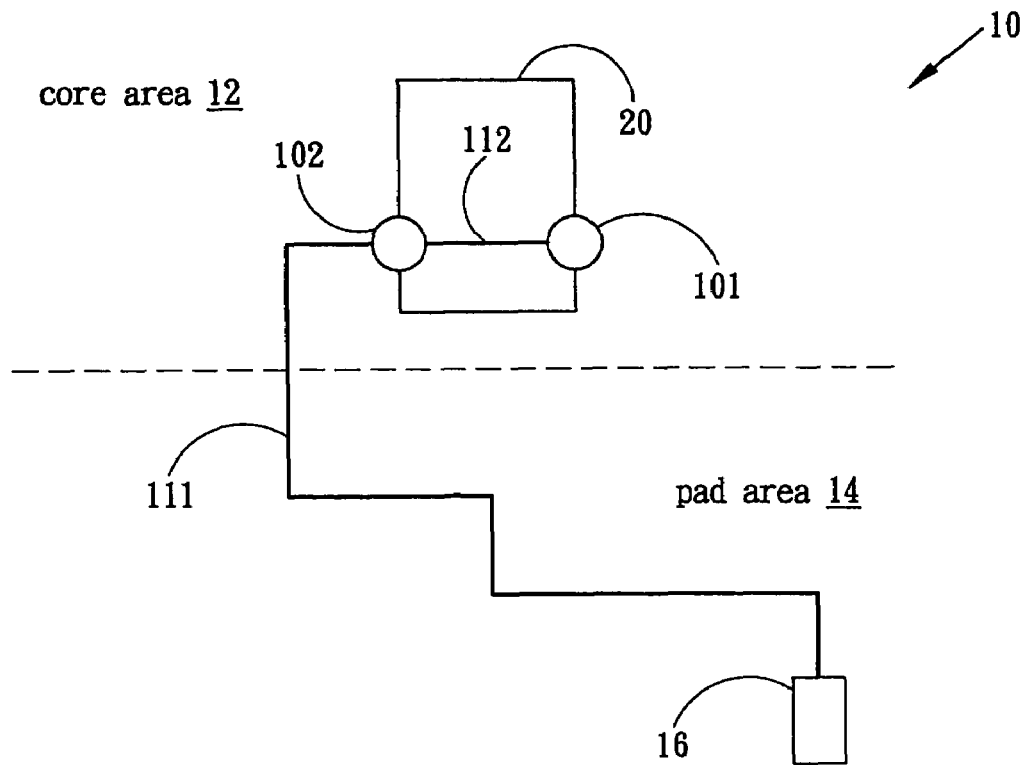
FIG. 1C shows a schematic diagram illustrating a conventional layout pattern of an OP in an integrated circuit.
Figure 1D:
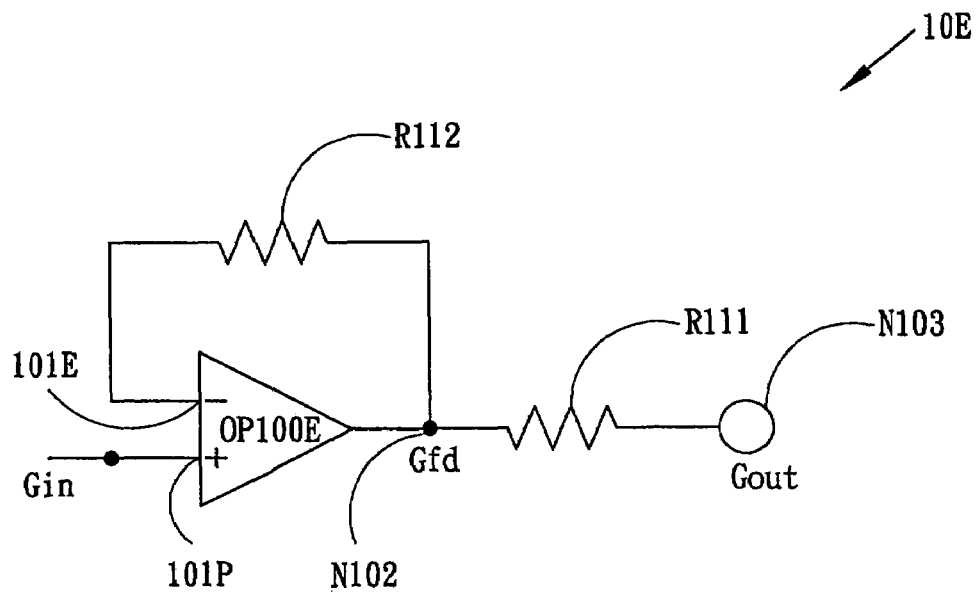
FIG. 1D shows the equivalent circuit corresponding to the OP illustrated by the layout pattern shown in FIG. 1C.
Figure 2A:
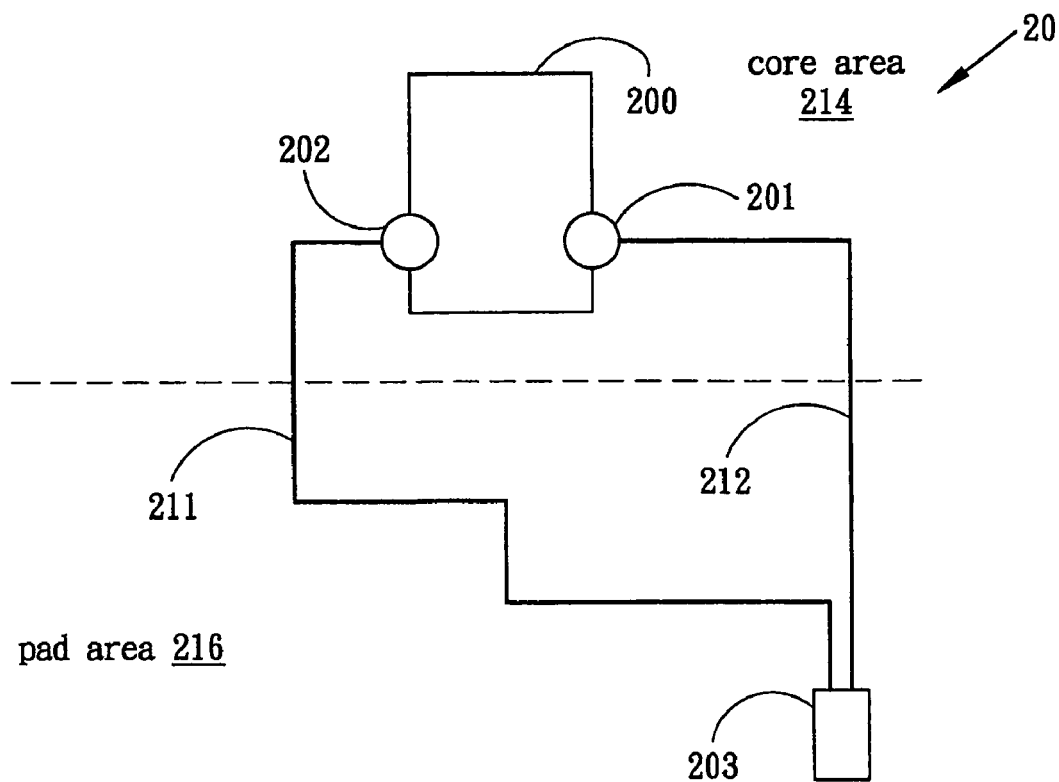
FIG. 2A shows a schematic diagram illustrating a layout pattern of an OP in an integrated circuit device in accordance with an embodiment of the present invention.

FIG. 2A shows a schematic diagram illustrating a layout pattern 20 of an OP in an integrated circuit device in accordance with an embodiment of the present invention. The integrated circuit in one example is a source driver for driving a display panel. The OP is used as an output buffer of a channel of the source driver. The layout pattern 20 includes an OP main body 200, an output pad 203, an output path 211 and a feedback path 212. The OP main body 200 includes a non-inverting input terminal 201 and an output terminal 202. The OP main body 200, OP input terminal 201 and OP output terminal 202 are disposed within the core area 214 of the integrated circuit. The output pad 203 is disposed in the pad area 216 of the integrated circuit. The output path 211 connects the output terminal 202 of the OP main body 200 in the core area 214 and the output pad 203 in the pad area 216. The feedback path 212 connects the input terminal 201 in the core area and the output pad 203 in the pad area. In contrast with the layout pattern 10 in FIG. 1C, the feedback path 212 is now constructed between the input terminal 201 and the output pad 203, instead of the output terminal 202. Again, although not explicitly specified in the figure, the OP main body 200 may further contain other elements such as additional input terminal, elements for differential operation as well as elements for amplifying operation. Moreover, the input terminal 201 and the output terminal 202 may lie in their respective input stage and output stage.

Figure 2B:
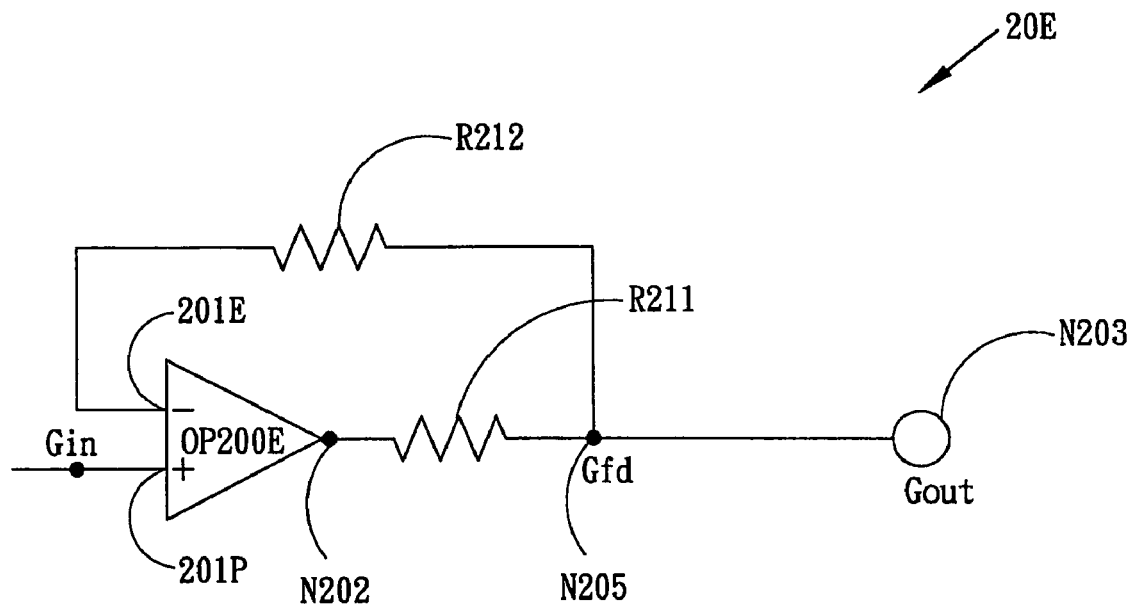
FIG. 2B shows the equivalent circuit corresponding to the OP illustrated by the layout pattern shown in FIG. 2A.

FIG. 2B shows the equivalent circuit 20E corresponding to the OP illustrated by the layout pattern 20 shown in FIG. 2A. The circuit 20E includes an OP 200E and an output pad N203. The OP 200E has an inverting input node 201E, a non-inverting input node 201P, and an output node N202. It should be understood that the OP 200E, the input node N201, the output node N202, the output pad N203 are respectively corresponding to the OP main body 200, the input terminal 201, the output terminal 202, the output pad 203 in the layout 20. The first resistor R211 and the second resistor R212 are respectively corresponding to the output path 211 and the feedback path 212 in the layout pattern 20. The notations Gin, Gfd and Gout are also used in this embodiment to represent the input voltage, the feedback voltage and the output voltage respectively. In this embodiment, the feedback voltage Gfd, however, is not the voltage at the output node N202 as explained below.

In this embodiment, the feedback point N205 is in the output pad 203. In other words, resistance between the feedback point N205 and the output pad 203 is almost zero and thus the feedback voltage Gfd is almost equal to the output voltage Gout. Therefore the output voltage is substantially equal to the input voltage Gin since feedback voltage Gfd is equal to the input voltage Gin due to that almost no current flows through the resistor R212.

FIG. 3 shows a schematic diagram illustrating a layout pattern 30 of an OP in an integrated circuit device in accordance with another embodiment of the present invention. The layout pattern 30 includes an OP main body 30Q, an output stage 307 containing an output terminal 302, an output pad 303, an output path 311, a feedback path 312 and a inner routing path 313. The OP includes a output stage 307 and a main body 300. The main body 300 and OP input terminal 301 are disposed within the core area 314 of the integrated circuit, while the output stage 307 and the output terminal 302 of the OP are disposed in the pad area. The output path 311 connects the output stage 307 and the output pad 303. The feedback path 312 connects the input terminal 301 in the core area 314 and the output stage 307 in the pad area 316. The inner routing path 313 connects the OP main body 300 in the core area 314 to the output stage 307 in the pad area 314. As shown in FIG. 3, the output stage 307 containing the output terminal 302 is moved from the OP main body 300 to a location very close to the output pad 303. Length of the output path 311 is therefore decreased such that the resistance between the output terminal 302 and the output pad 303 is decreased significantly. Therefore, the output voltage at the output pad 303 is almost equal to the input voltage for the OP.

Specifically, length of the output path 311 defines a minimum distance between the output stage 307 and the output pad 303 (i.e., the shortest distance between any point in the output stage 307 and any point in the output pad 303). The length of the output path 311 is preferably less than a tenth (1/10) of the length of the feedback path 312 which also functions as the feedback path for the OP. Additionally, the length of the output path 311 is preferably less than a tenth (1/10) of the inner routing path 313. Furthermore, the length of the output path 311 is preferably less than 10 micrometers and more preferably less than 5 micrometers. The result resistance of the output path 311 is preferably under 10 ohms which will, for example, lead to an output voltage offset less than 20 mV for an output driving current of 2 mA.

Please now refer to FIG. 4, it is a flow chart according to FIG. 2A and FIG. 3. FIG. 4 summarizes the essential steps of a method for implementing the layout of an integrated circuit containing an OP in accordance with an aspect of the present invention. In step 402, an output path is constructed between an output terminal of the OP and an output pad of the OP. In other words, the output path connects the output terminal to the output pad. In the embodiment illustrated in FIG. 2A, for example, the step 402 may form the output path 211 connecting the output terminal 202 to the output pad 203. In the embodiment shown in FIG. 3, the step 402 may form the output path 311 connecting the output terminal 302 to the output pad 303.

In step 403, a feedback path (also called a feedback path 312) is constructed between an input terminal of the OP and a specific element thereof lying in an area covering the output pad, in which the minimum distance between the specific element and the output pad is less than a tenth of the length of the feedback path. In other words, it is contemplated that the feedback path may connect the input terminal to the output pad or to an element close to the output pad. In the embodiment illustrated in FIG. 2A, for example, the step 403 may form the feedback path 212 connecting the input terminal 201 and the output pad 203. In other words, in the embodiment illustrated in FIG. 2A, the specific element is the output pad 203. In the embodiment illustrated in FIG. 3, on the other hand, the step 403 may form the feedback path 312 connecting the input terminal 301 and the output stage 307 which contains the output terminal 302. The specific element is now the output stage 307 which is further connected to the OP main body 300 through the inner routing path 313.

It is noted that, in FIG. 3, there shows a dotted circle representing an imaginary area 350 covering the output pad 303. The imaginary circle 350 put therein is to illustrate that the feedback path 312 is preferably formed to connect the input terminal 301 to the output pad 303 or an element (such as the output stage 307) close to the output pad 303.

As described above, length of the output path 311 means a minimum distance between the output terminal 302 and the output pad 303. As also described above, the length of the output path 311 is preferably less than a tenth of the inner routing path 313. Furthermore, the length of the output path 311 is preferably less than 10 micrometers and more preferably less than 5 micrometers. The result resistance of the output path 311 is preferably under 10 ohms which will, for example, lead to an output voltage offset less than 20 mV for an output driving current of 2 mA.

The foregoing description of the exemplary embodiment of the invention has been presented for the purposes of illustration and description. It is not intended to be exhaustive or to limit the invention to the precise form disclosed. Many modifications and variations are possible in light of the above teaching. The disclosed method, for example, may be feasibly applied to a PCB (plastic circuit board) layout application including an OP. It is intended that the scope of the invention be limited not with this detailed description, but rather by the claims appended hereto.

What is claimed is:

1. A source driver having a core area in a center and a pad area around the core area, the source driver comprising:
    a plurality of channels each comprising an output buffer, the output buffer comprising an operational amplifier having an input stage and an output stage, wherein the input stage is positioned in the core area;
    a plurality of output pads positioned in the pad area;
    a plurality of output paths, each connecting an output terminal of the output stage of corresponding one operational amplifier to the corresponding output pad; and
    a plurality of feedback paths, each connecting an input terminal of the input stage of corresponding one operational amplifier to the corresponding output pad.

2. The source driver of claim 1, wherein said operational amplifier is used as a unit gain buffer due to said feedback path.

3. The source driver of claim 1, wherein said output stages of the operational amplifiers are positioned in the core area.

4. The source driver of claim 1, wherein said output stage is positioned in the pad area and the operational amplifier further compromises an inner routing path for connecting the input stage to the output stage.

5. An integrated circuit device having a core area in a center and a pad area around the core area, the integrated circuit comprising:
    an operational amplifier having an input stage and an output stage, wherein the input stage is positioned in the core area;
    an output pad positioned in the pad area;
    an output path connecting an output terminal of the output stage to said output pad; and
    a feedback path connecting an input terminal of the input stage to the output pad.

6. The integrated circuit device of claim 5, wherein said operational amplifier is used as a unit gain buffer due to said feedback path.

7. The integrated circuit device of claim 5, wherein said output stage is positioned in the core area.

8. The integrated circuit device of claim 5, wherein said output stage is positioned in the pad area, and the operational amplifier further compromises an inner routing path for connecting said input stage to said output stage.

9. The integrated circuit device of claim 8, wherein length of said output path is less than a tenth of length of said inner routing path.

10. The integrated circuit device of claim 8, wherein length of said output path is less than 5 micrometers.

11. The integrated circuit device of claim 8, wherein resistance of said output path is less than 10 ohms.

* * * * *